(12) United States Patent
Chen

(10) Patent No.: US 7,132,685 B2
(45) Date of Patent: Nov. 7, 2006

(54) ASYMMETRY THIN-FILM TRANSISTOR

(75) Inventor: Kun-Hong Chen, Taipei Hsien (TW)

(73) Assignee: AU Optronics Corp., Hsin-Chu (TW)

( * ) Notice: Subject to any disclaimer, the term of this patent is extended or adjusted under 35 U.S.C. 154(b) by 0 days.

(21) Appl. No.: 10/463,406

(22) Filed: Jun. 18, 2003

(65) Prior Publication Data

US 2004/0201017 A1    Oct. 14, 2004

(30) Foreign Application Priority Data

Apr. 10, 2003    (TW) ............... 92108281 A

(51) Int. Cl.
*H01L 29/04*    (2006.01)
(52) U.S. Cl. .......................... 257/57; 257/61
(58) Field of Classification Search ............... 257/57, 257/59, 60, 61, 69
See application file for complete search history.

(56) References Cited

U.S. PATENT DOCUMENTS

| | | | |
|---|---|---|---|
| 6,013,930 A * | 1/2000 | Yamazaki et al. | 257/353 |
| 6,753,576 B1 * | 6/2004 | Sundaresan | 257/344 |
| 2002/0028544 A1 * | 3/2002 | Fujimoto et al. | 438/166 |
| 2004/0238820 A1 * | 12/2004 | Sakama et al. | 257/59 |

* cited by examiner

*Primary Examiner*—Hung Vu
(74) *Attorney, Agent, or Firm*—Winston Hsu

(57) ABSTRACT

An asymmetry thin-film transistor includes a substrate, a semiconductor layer and a gate positioned on the substrate. The semiconductor layer includes a first lightly doped region and a first heavily doped region adjacent to a first gate side, and a second lightly doped region together with a second heavily doped region adjacent to a second gate side. A first junction is between the first lightly doped region and the first heavily doped region. A second junction is between the second lightly doped region and the second heavily doped region. A distance between the first junction and the first gate side is unequal to a distance between the second junction and the second gate side.

37 Claims, 18 Drawing Sheets

ASYMMETRY THIN-FILM TRANSISTOR

BACKGROUND OF INVENTION

1. Field of the Invention

The present invention relates to an asymmetry thin-film transistor (TFT), and more particularly, to an asymmetry thin-film transistor in a liquid crystal display.

2. Description of the Prior Art

From the fact that a thin-film transistor having an active layer formed of a crystalline silicon film on a substrate having an insulating surface has a high electric field effect mobility, it is possible to form a variety of functional circuits. For example, in the active matrix liquid crystal device (AMLCD) employing the crystalline silicon thin-film transistor, a thin-film transistor used as a pixel switch is formed in every pixel of an imaged is play region, and a thin-film transistor used in a drive circuit is formed in the periphery of the image display region.

Since the functions and the operating conditions of the thin-film transistors in the pixel and the drive circuit are not the same, the characteristics that are demanded for a thin-film transistor is somewhat different. For example, the pixel thin-film transistor is demanded to function as a switch device for applying a voltage to a liquid crystal, so as to control the rotation angle of the liquid crystal. In this case, the characteristic that is demanded for the pixel thin-film transistor was to sufficiently lower an off-current value (a drain current that flows during an off-operation of the thin-film transistor), so as to maintain sufficient electric charges in a pixel storage capacitor.

Please refer to FIG. 1 of a cross-sectional diagram of a thin-film transistor according to the prior art. A thin-film transistor 10 includes a substrate 12, a semiconductor layer 14 positioned on the substrate 12, a gate insulating layer 16 positioned on the semiconductor layer 14, and a gate 18 positioned on the gate insulating layer 16. The semiconductor layer 14 includes two symmetric lightly doped drains (LDD) 20 and 22 and two symmetric source/drain regions 24 and 26 adjacent to the gate 18. A channel region 28 is defined between the lightly doped drain 20 and the lightly doped drain 22.

The lightly doped drains 20 and 22 are formed of n-type dopants to reduce leakage currents of the thin-film transistor, and prevent the electric field around the drain from getting too high to bring hot electron effects. Having lower dopant densities, the resistance of the lightly doped drains 20 and 22 is usually higher than the resistance of the source/drain regions 24 and 26. Therefore, the series resistance between the drain and the source 24, 26 is increased to reduce the electron mobility and the device operation speeds with the insertion of the lightly doped drains 20 and 22. In this case, the device operation speeds have to be sacrificed when using the lightly doped drains to solve the leakage current problems. Therefore, how to value the characteristics of the electron mobility and the leakage current values has become an important issue in the design and the fabrication of the lightly doped drains.

Please refer to FIG. 2 to FIG. 5 of schematic diagrams to respectively illustrate correlations of an LDD length with a threshold voltage, electron mobility and a leakage current value (including an off-current Ioff measured during an off-operation or a drain current Id measured during a reverse-bias operation) of a thin-film transistor. As shown in these diagrams, when a length of the lightly doped drains 20 and 22 increases from 0 to 3 micrometers (μm), a threshold voltage increases, electron mobility reduces, and a leakage current value (Ioff or Id) reduces. It is obvious that one cannot keep high electron mobility and reduce leakage currents at the same time. Therefore, it is difficult to improve the device performances effectively.

SUMMARY OF INVENTION

It is therefore an objective of the claimed invention to provide an asymmetry thin-film transistor to improve electron mobility and reduce leakage currents as well.

According to the claimed invention, the thin-film transistor includes a substrate; a semiconductor layer positioned on the substrate, the semiconductor layer including a channel region, a first lightly doped region and a first heavily doped region positioned at a side of the channel region, a second lightly doped region and a second heavily doped region positioned at the other side of the channel region, a first junction being formed between the first lightly doped region and the first heavily doped region, and a second junction being formed between the second lightly doped region and the second heavily doped region; and a gate positioned on the substrate, the gate including a first gate side and a second gate side, a distance between the first gate side and the first junction being unequal to a distance between the second gate side and the second junction.

It is an advantage of the claimed invention that the thin-film transistor has asymmetric lightly doped regions (lightly doped drains). A length of the lightly doped drain adjacent to the drain, which region has higher sensitivity to the leakage current problems, is increased to an appropriate value to reduce the leakage currents of the thin-film transistor. In addition, the series resistance between the drain and the source can also be reduced by decreasing a length of the lightly doped drain adjacent to the source, or even completely removing the lightly doped drain adjacent to the source. As a result, both of the electron mobility and the device operation speeds can be improved according to the present invention.

These and other objectives of the claimed invention will no doubt become obvious to those of ordinary skill in the art after reading the following detailed description of the preferred embodiment that is illustrated in the various figures and drawings.

BRIEF DESCRIPTION OF DRAWINGS

The following detailed description, given by way of examples and not intended to limit the invention to the embodiments described herein, will best be understood in conjunction with the accompanying drawings, in which.

IN THE DETAILED DESCRIPTION

Figure 6:
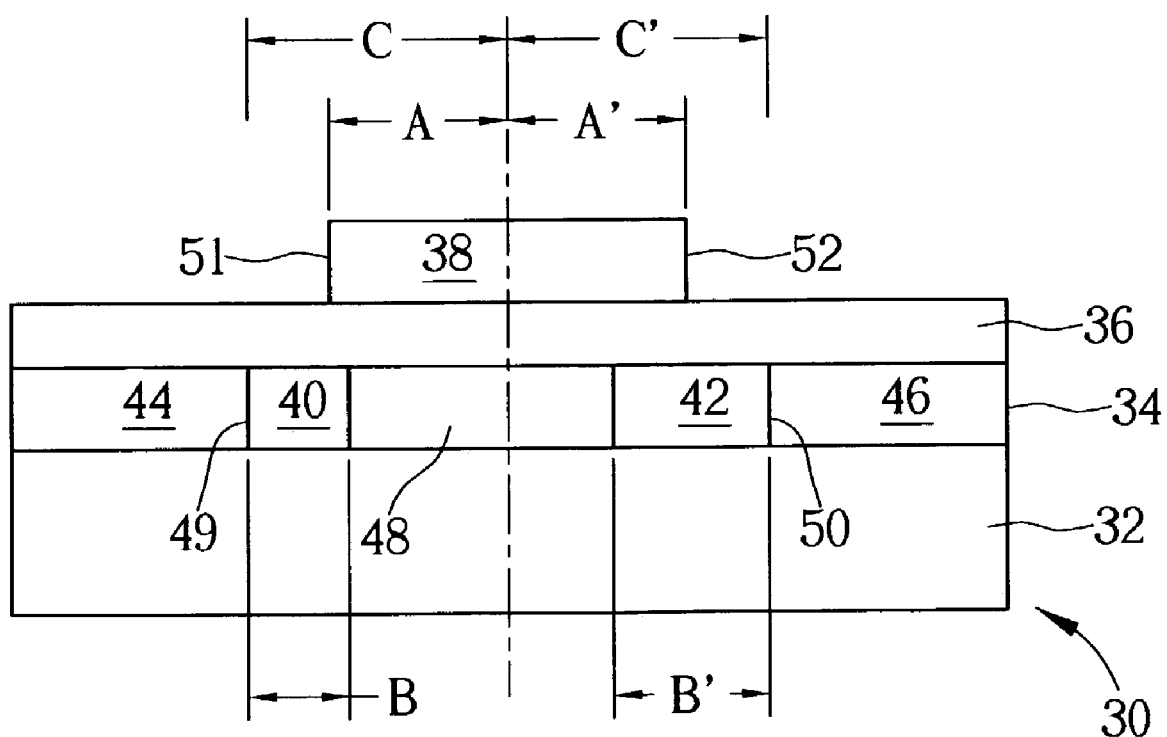
FIG. 6 is a cross-sectional diagram of a thin-film transistor according to a first embodiment of the present invention.

Please refer to FIG. 6 of a cross-sectional diagram of a thin-film transistor according to a first embodiment of the present-invention. A thin-film transistor 30 shown in FIG. 6 is used as a pixel switch. However, the thin-film transistor 30 may also be used in other functional circuits in a liquid crystal display or in other electronic products. Normally, the thin-film transistor 30 is an n-type thin-film transistor. However, the thin-film transistor 30 may also be a p-type thin-film transistor according to the present invention.

The thin-film transistor 30 includes a semiconductor layer 34 positioned on a substrate 32, a gate insulating layer 36 positioned on the semiconductor layer 34, and a gate 38 positioned on the gate insulating layer 36. The semiconductor layer 34 includes two lightly doped drains 40 and 42 formed in different lengths, and two source/drain regions 44 and 46 adjacent to the gate 38. The lightly doped drains 40, 42 and the source/drain regions 44, 46 are all n-type doped regions. The lengths of the lightly doped drains 40 and 42 range between 0 and 3.5 µm, respectively. The gate 38 is made of conductive materials such as metal or doped polysilicon. In addition, a channel region 48 is defined between the lightly doped drain 40 and the lightly doped drain 42.

The thin-film transistor 30 further includes a junction 49 positioned between the lightly doped drain 40 and the source/drain region 44, a junction 50 positioned between the lightly doped drain 42 and the source/drain region 46, a left gate side 51, and a right gate side 52. In order to specifically define the thin-film transistor 30, some parameters are defined as follows: a distance between the gate side 51 and the center of the gate 38 is defined as A; a distance between the gate side 52 and the center of the gate 38 is defined as A'; a length of the lightly doped drain 40 is defined as B; a length of the lightly doped drain 42 is defined as B'; a distance between the junction 49 and the center of the gate 38 is defined as C; and a distance between the junction 50 and the center of the gate 38 is defined as C'. The correlations of these parameters are listed below:

A=A', B≠B', C=C'.

The gate side 51 overlaps with the lightly doped drain 40 and the gate side 52 overlaps with the lightly doped drain 42 to make the gate 38 covers both of the lightly doped drain 40 and the lightly doped drain 42. In other embodiments of the present invention, however, it is not necessary for both of the two gate sides to overlap with the lightly doped drains.

An adjustment can be made to change the relative positions of the gate to the lightly doped drains depending on the device electricity demands.

Figure 7:
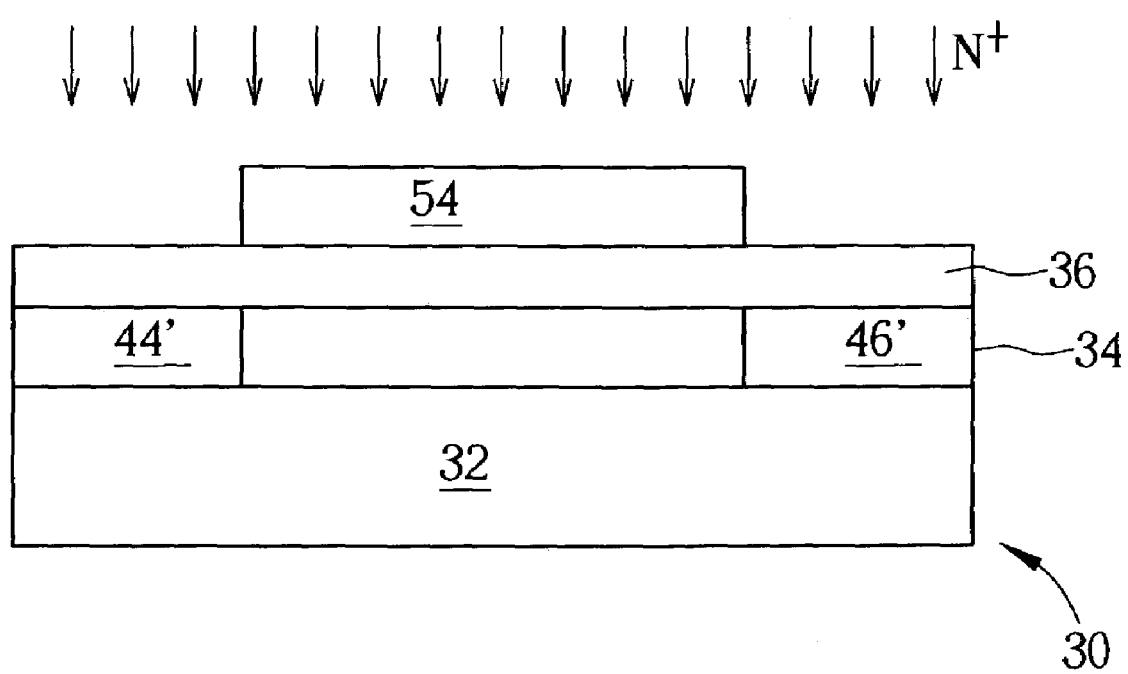
FIG. 7 to FIG. 9 are schematic diagrams of a method of forming a thin-film transistor according to the present invention.
Figure 8:
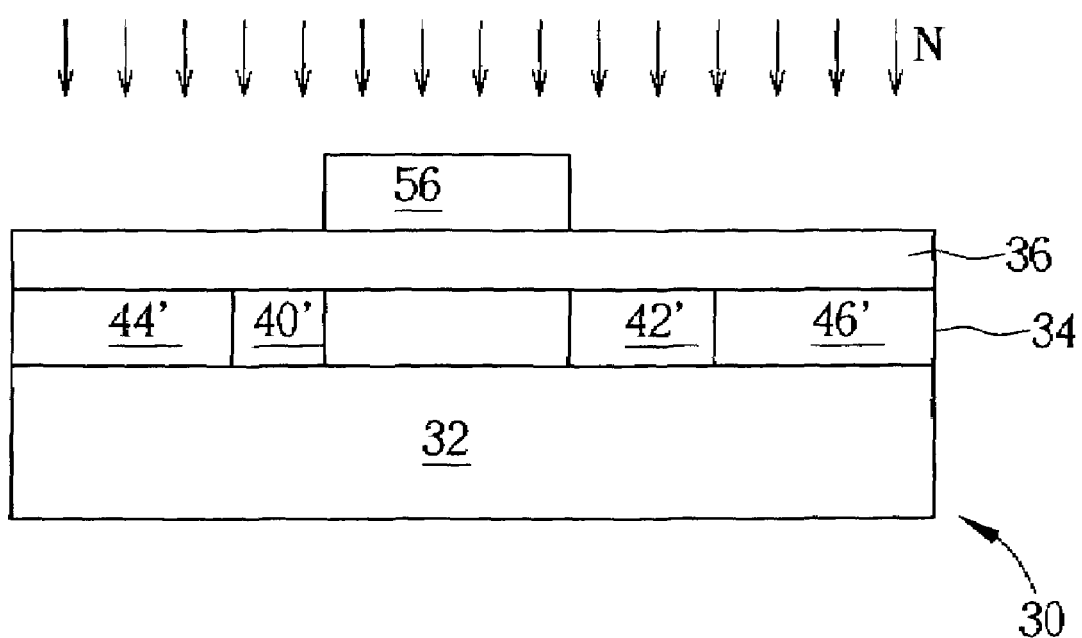
Figure 9:
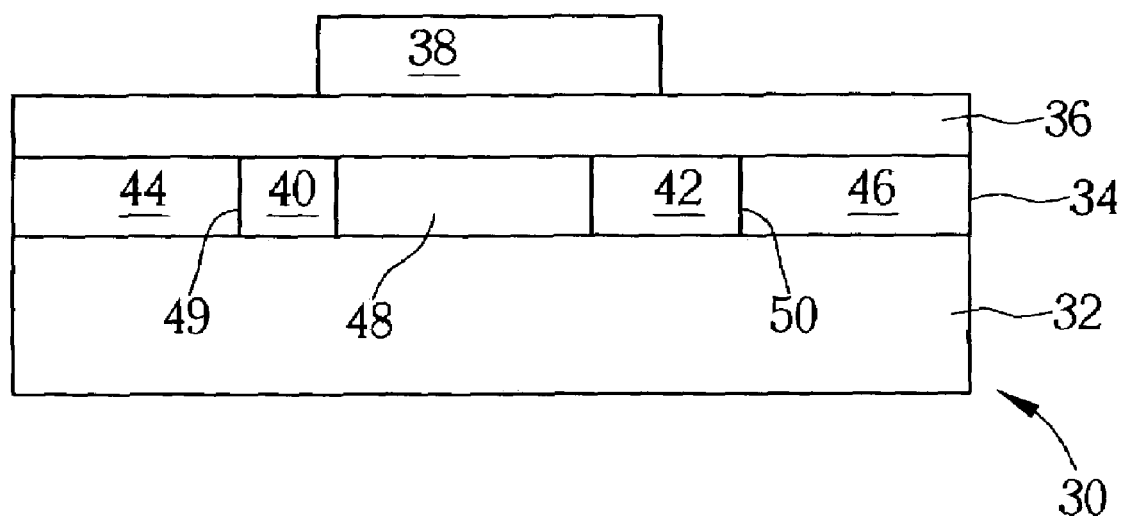

Please refer to FIG. 7 to FIG. 9 of schematic diagrams of a method of forming the thin-film transistor 30 according to the present invention. As shown in FIG. 7, the semiconductor layer 34 is formed on the substrate 32 and the gate insulating layer 36 is formed to cover the semiconductor layer 34. Following that, a mask layer 54 is formed on the gate insulating layer 36 to define patterns and positions of the source and the drain of the thin-film transistor 30. An ion implantation process is then performed to form two N+ doped regions 44' and 46' in the semiconductor layer 36 at either sides of the mask layer 54.

As shown in FIG. 8, after removing the mask layer 54, another mask layer 56 is formed on the gate insulating layer 36 to define patterns and positions of the lightly doped drains of the thin-film transistor 30. An ion implantation process is then used to form two N-doped regions 40' and 42' in different lengths in the semiconductor layer 36 at either sides of the mask layer 56. Subsequently, as shown in FIG. 9, after removing the mask layer 56, a heat treatment is used to activate the ions implanted into the doped regions 40', 42', 44', and 46', thus completing the fabrication of the lightly doped drains 40, 42 and the source/drain regions 44, 46. Finally, the gate 38 is formed and patterned on the gate insulating layer 36 to complete the thin-film transistor 30.

Photolithographic and etching processes can be used to define the position of the mask layer 56 precisely, therefore the positions and the lengths of the lightly doped drains 40 and 42 can be easily controlled according to the present invention. In addition, when patterning the gate 38, the photolithographic and etching processes can also be used to control the relative positions of the gate 38 to the lightly doped drains 40, 42.

Figure 10:
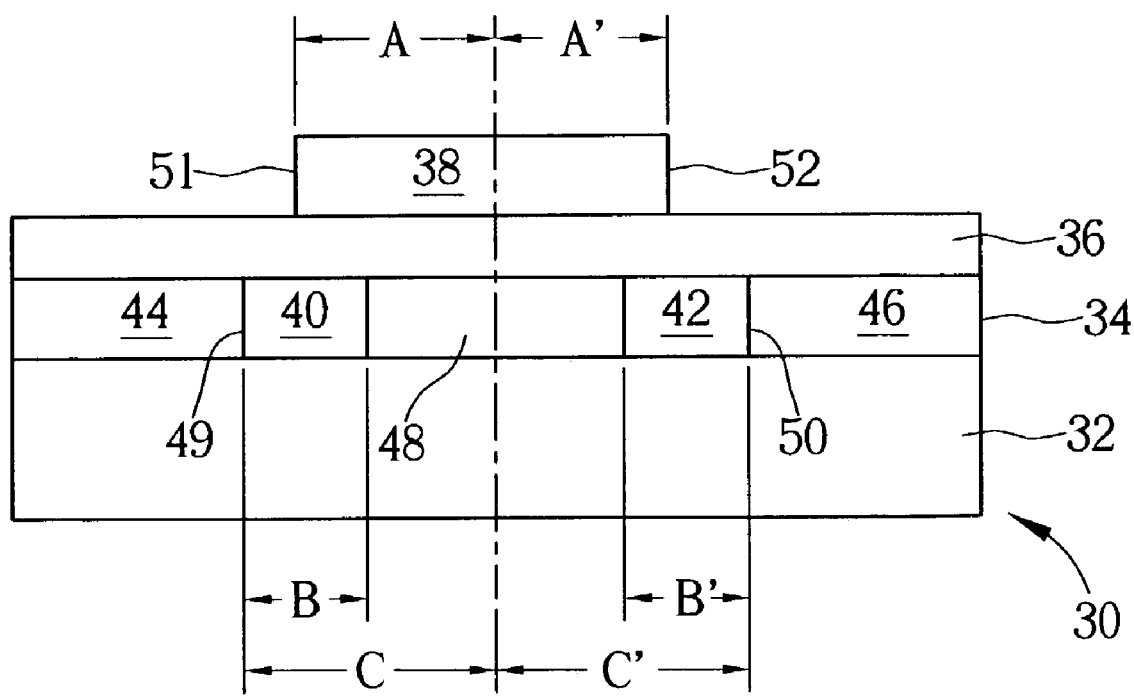
FIG. 10 is a cross-sectional diagram of a thin-film transistor according to a second embodiment of the present invention.

Please refer to FIG. 10 of a cross-sectional diagram of a thin-film transistor according to a second embodiment of the present invention. All the elements of this embodiment are the same as those disclosed in the first embodiment except the relative positions between the gate 38 and the lightly doped drains 40, 42 are changed. As shown in FIG. 10, the gate 38 is not symmetric to the center of the channel region 48. The lightly doped drains 40 and 42 have the same lengths and are symmetric to the center of the channel region 48. In order to specifically define the thin-film transistor 30 of this embodiment, some parameters are defined as follows: a distance between the gate side 51 and the center of the gate 38 is defined as A; a distance between the gate side 52 and the center of the gate 38 is defined as A'; a length of the lightly doped drain 40 is defined as B; a length of the lightly doped drain 42 is defined as B'; a distance between the junction 49 and the center of the channel region 48 is defined as C; and a distance between the junction 50 and the center of the channel region 48 is defined as C'. The correlations of these parameters are listed below:

A≠A', B=B', C=C'.

Figure 11:
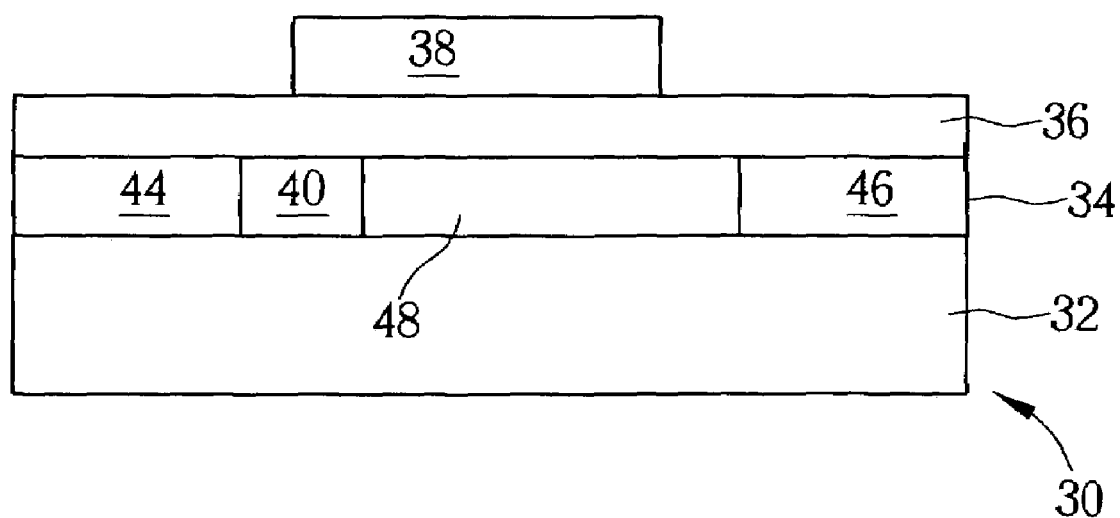
FIG. 11 is a cross-sectional diagram of a thin-film transistor according to a third embodiment of the present invention.

Please refer to FIG. 11 of a cross-sectional diagram of a thin-film transistor according to a third embodiment of the present invention. All the elements of this embodiment are the same as those disclosed in the first embodiment except the lightly doped drain 42 shown in the first embodiment is removed from this embodiment. In general, a voltage (electric field) remains between the drain and the substrate when the transistor is turned off, thus generating leakage currents. Since the leakage current problems are more sensitive around the drain, the lightly doped drain 40 is used to reduce the leakage currents around the drain according to the present invention. In addition, the lightly doped drain adjacent to the source is completely removed in this embodiment to reduce the series resistance between the drain and the source, therefore improving both of the electron mobility and the device operation speeds.

Figure 1:
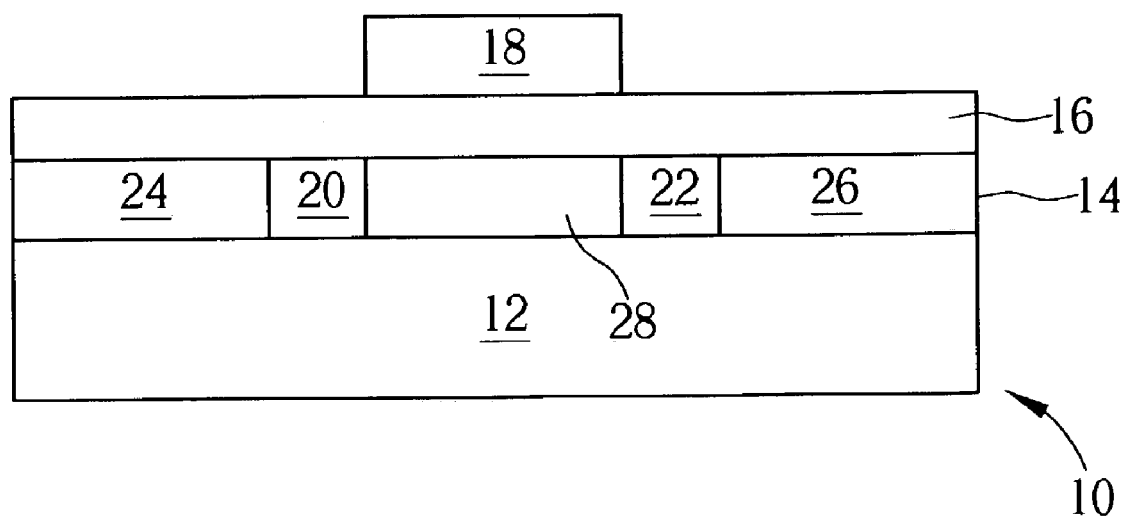
FIG. 1 is a cross-sectional diagram of a thin-film transistor according to the prior art.
Figure 2:
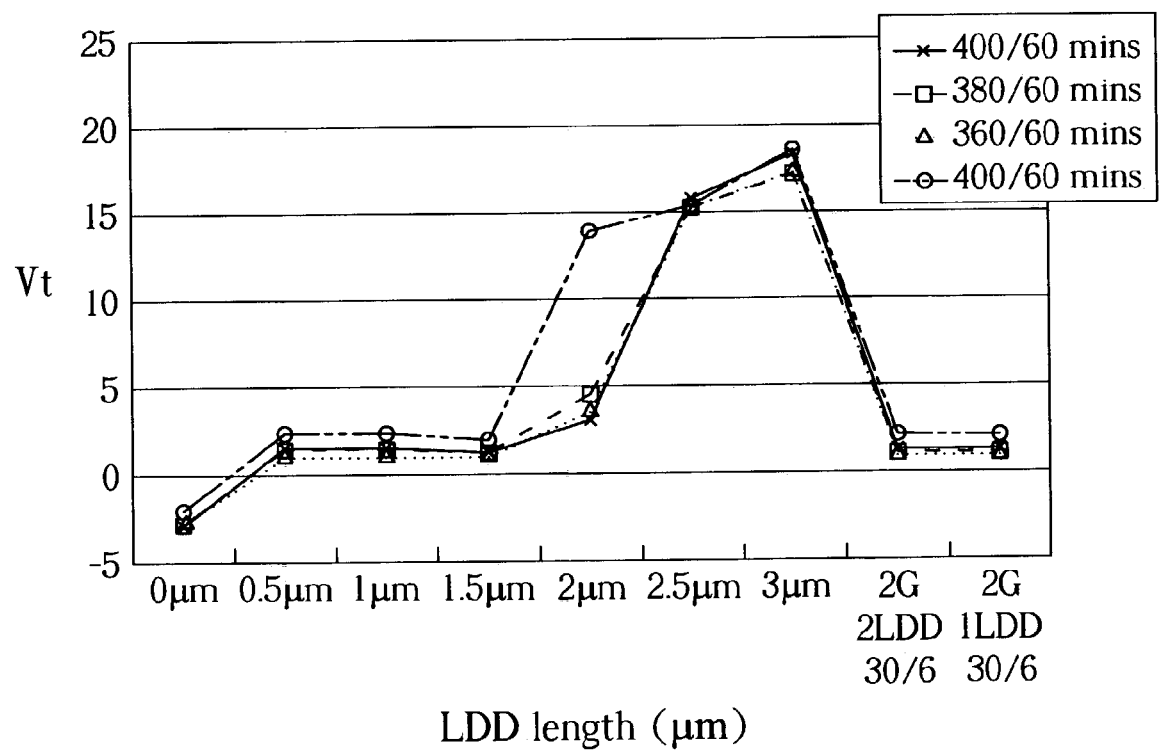
FIG. 2 is a schematic diagram of illustrating a correlation between a threshold voltage and an LDD length of a thin-film transistor.
Figure 3:
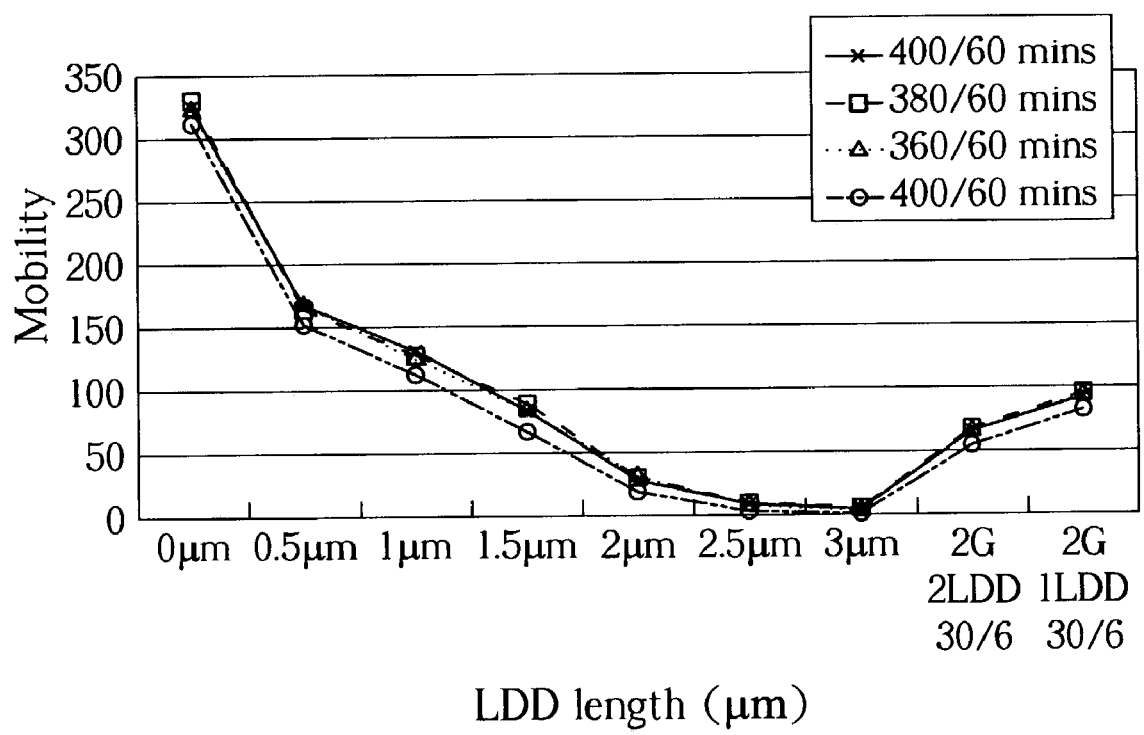
FIG. 3 is a schematic diagram of illustrating a correlation between electron mobility and an LDD length of a thin-film transistor.
Figure 4:
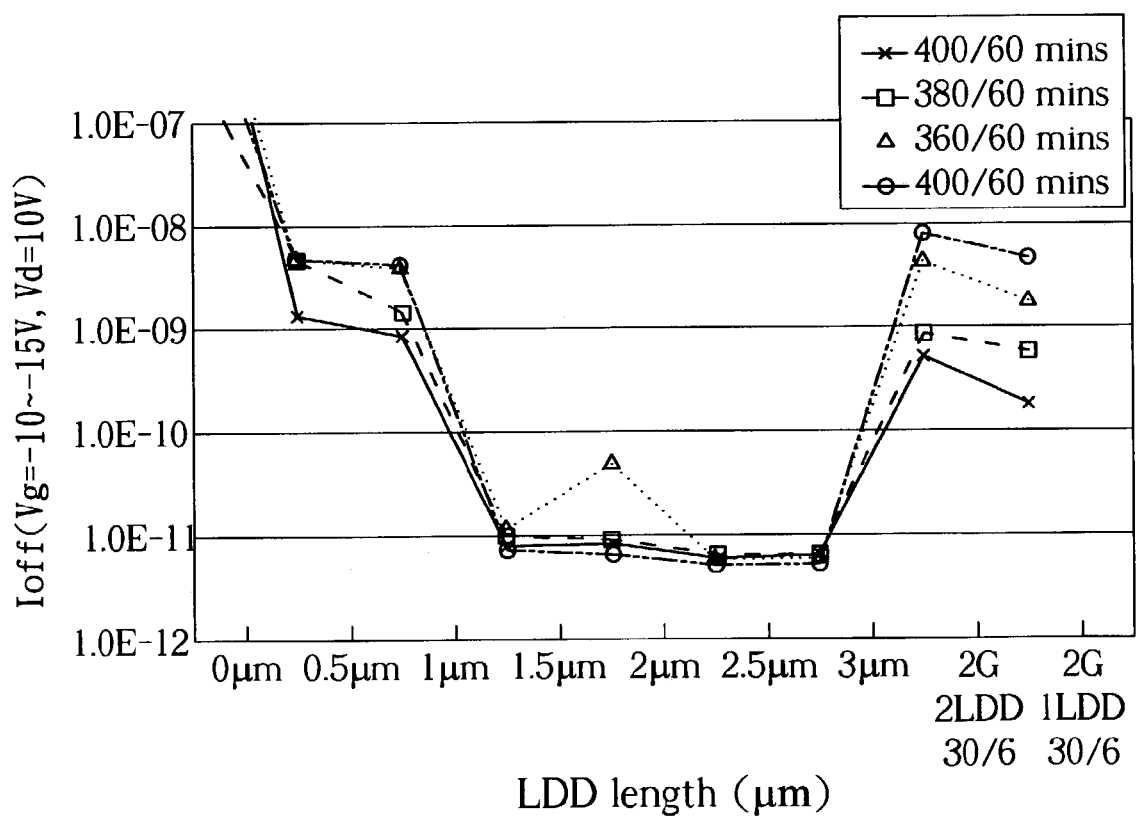
FIG. 4 is a schematic diagram of illustrating a correlation between a leakage current value and an LDD length of a thin-film transistor.
Figure 5:
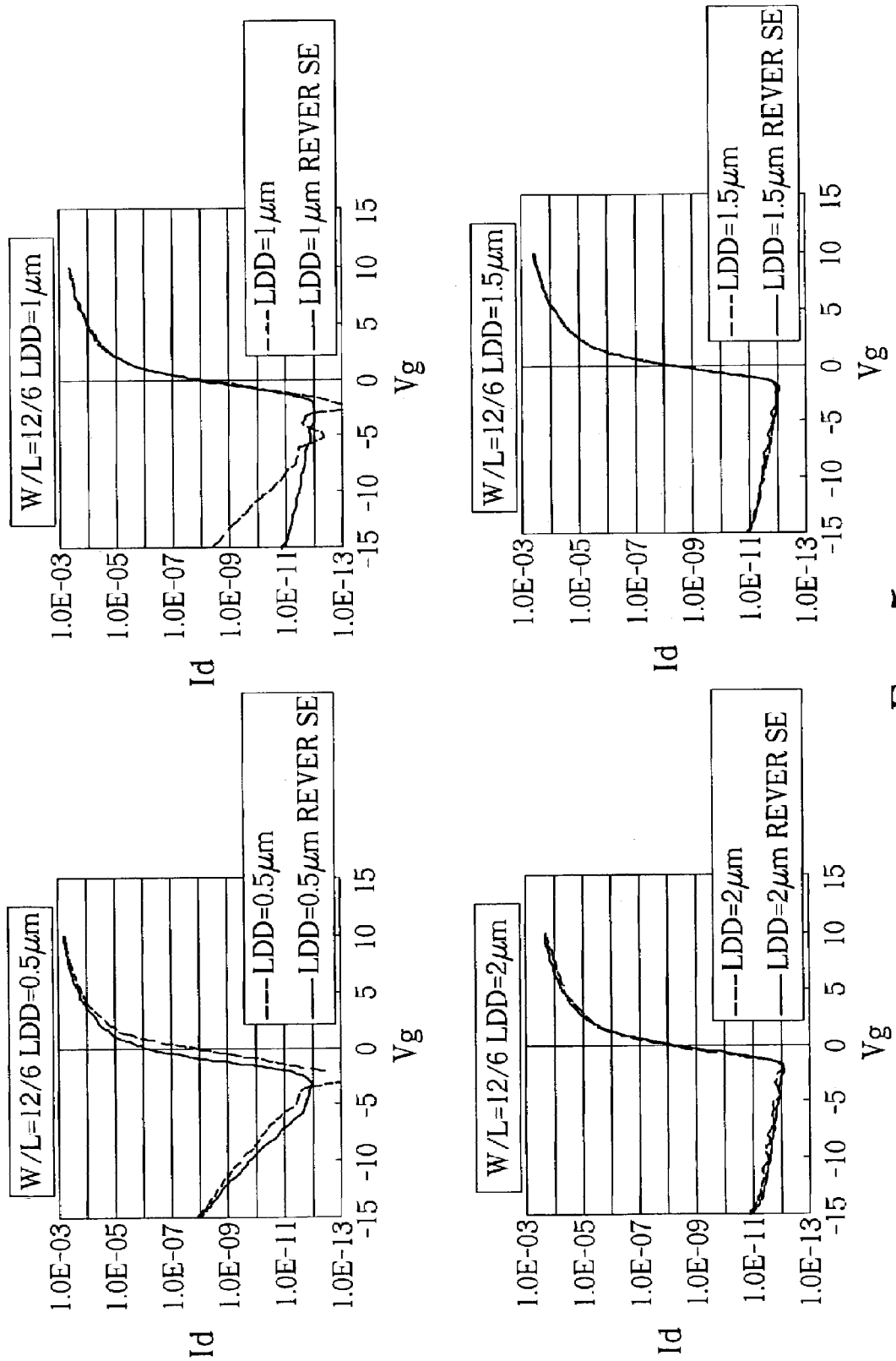
FIG. 5 is a schematic diagram for comparing leakage currents of thin-film transistors with different LDD lengths.
Figure 12:
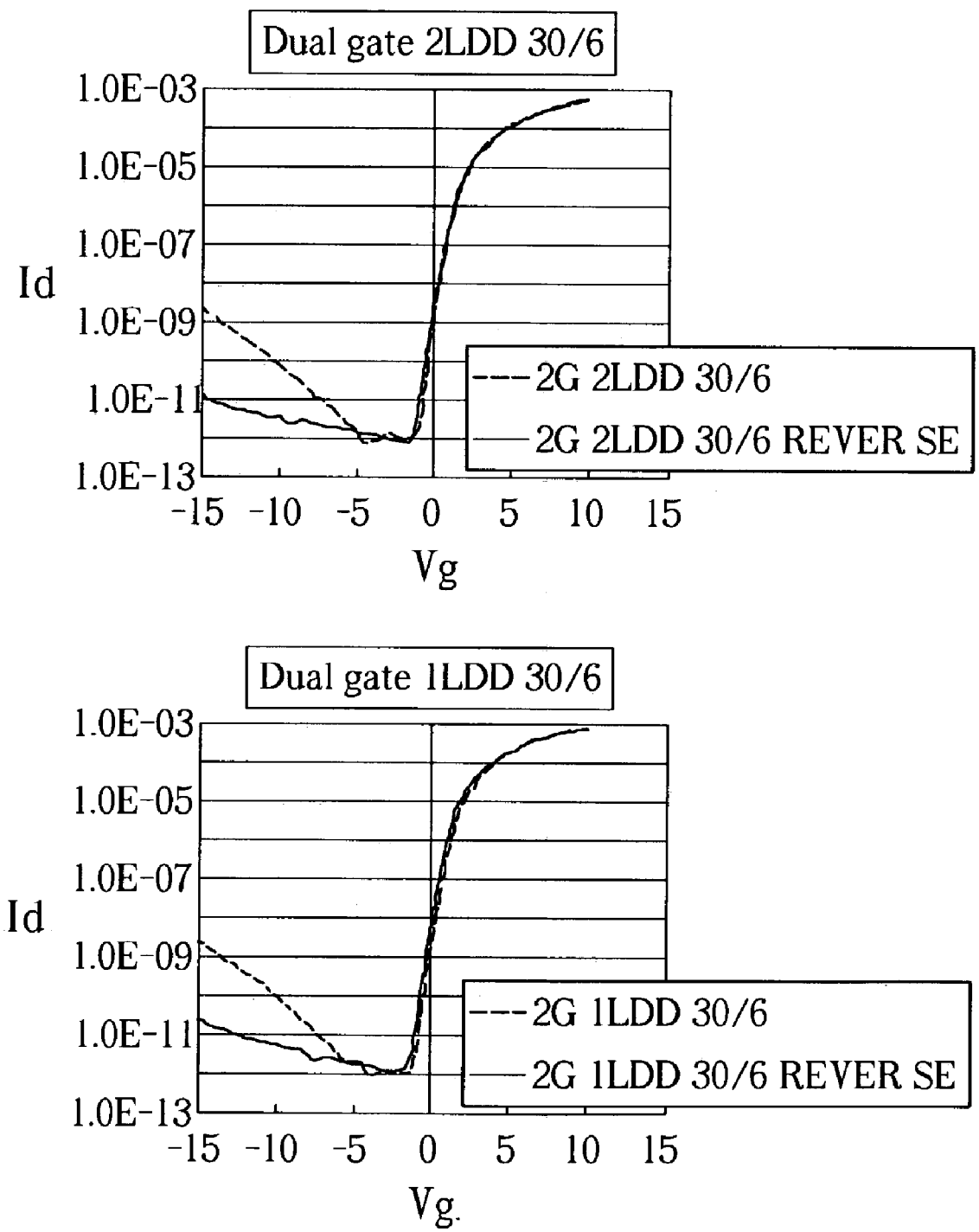
FIG. 12 is a schematic diagram for comparing leakage currents between a single LDD thin-film transistor and a dual LDD thin-film transistor.

A leakage current (a drain current measured at a reverse-bias operation) comparison between the single LDD thin-film transistor of this embodiment and the dual LDD thin-film transistor of the first embodiment is illustrated in FIG. 12. A threshold voltage comparison and an electron mobility comparison between these two transistors are illustrated at the right side portions in FIG. 2 and FIG. 3, respectively. From the comparison results, the single LDD thin-film transistor still has the advantages of reducing leakage currents and improving electron mobility as the dual LDD thin-film transistor does.

The present invention is characterized by adjusting the relative positions of the lightly doped drains to the gate to provide an asymmetry thin-film transistor to reduce leakage currents. The asymmetry structure is not limited in the top-gate thin-film transistor, which has the gate positioned above the semiconductor layer, as mentioned in the above paragraphs. A bottom-gate thin-film transistor, which has a gate positioned below a semiconductor layer, may also be applied in the present invention to form in an asymmetry structure. In this case, the gate insulating layer and the gate are formed on the substrate firstly. Following that, an insulating layer and the semiconductor layer including the lightly doped drain(s) and the source/drain regions are formed on the gate. The relative positions of the lightly doped drains to the gate should be adjusted, so as to form the thin-film transistor in the asymmetry structure to reduce the leakage currents.

Figure 13:
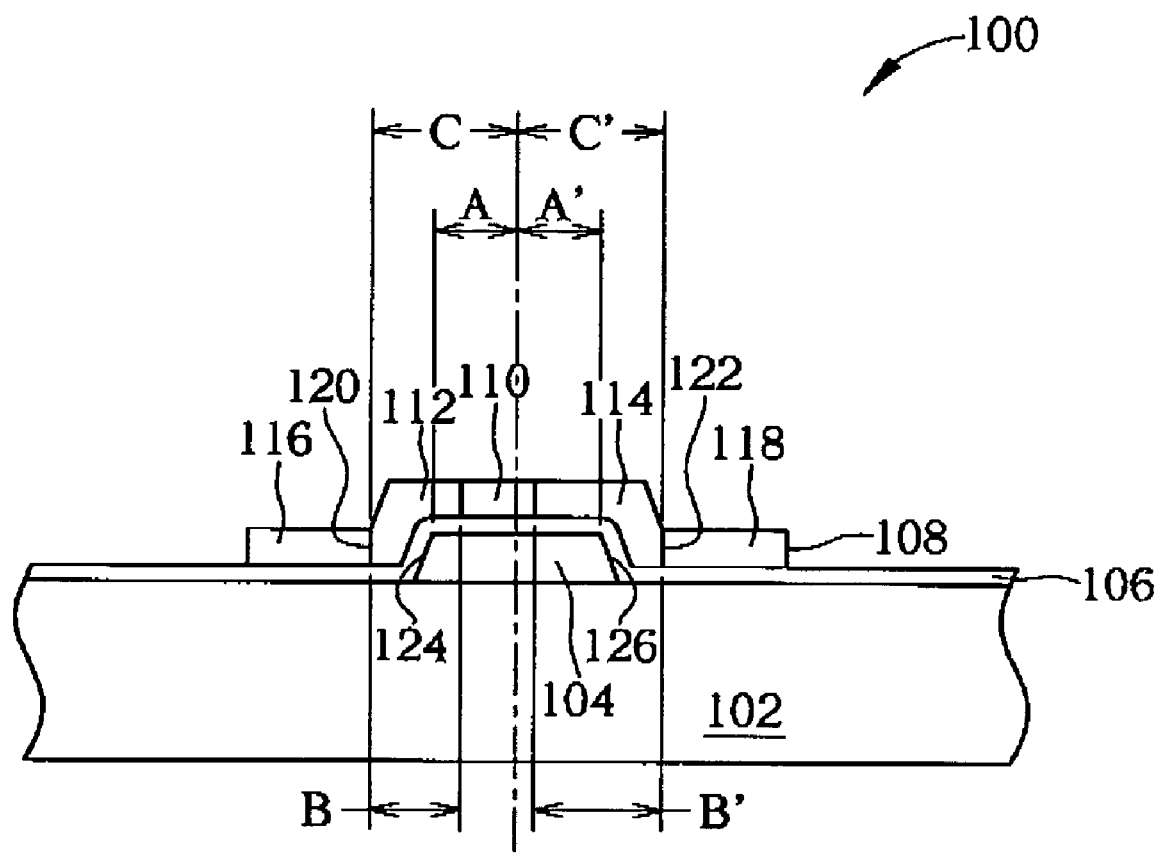
FIG. 13 is a cross-sectional diagram of a bottom sate thin-film transistor according to a fourth embodiment of the present invention.

Please refer to FIG. 13. FIG. 13 is a cross-sectional diagram of a bottom gate thin-film transistor according to a fourth embodiment of the present invention. As shown in FIG. 13, the bottom gate thin-film transistor 100 includes a gate 104 positioned on a substrate 102, a gate insulating layer 106 positioned on the gate 104 and the substrate 102, and a semiconductor layer 108 positioned on the gate insulating layer 106. The semiconductor layer 108 includes a channel region 110, two lightly doped drains 112 and 114 having different lengths on both sides of the channel region 110, and two source/drain regions 116 and 118 respectively next to the lightly doped drains 112 and 114. The lightly doped drains 112, 114 and the source/drain regions 116, 118 are all n-type doped regions. The lengths of the lightly doped drains 112 and 114 range between 0 and 3.5 µm, respectively. The gate 104 is made of conductive materials such as metal or doped polysilicon. It is noteworthy that the bottom gate thin-film transistor may also be p-type where necessary.

The bottom gate thin-film transistor 100 further includes a junction 120 positioned between the lightly doped drain 112 and the source/drain region 116, a junction 122 positioned between the lightly doped drain 114 and the source/drain region 118, a left gate side 124, and a right gate side 126. In order to specifically define the thin-film transistor 100, some parameters are defined as follows: a distance between the gate side 124 and the center of the gate 104 is defined as A; a distance between the gate side 126 and the center of the gate 104 is defined as A'; a length of the lightly doped drain 112 is defined as B; a length of the lightly doped drain 114 is defined as B'; a distance between the junction 120 and the center of the gate 104 is defined as C; and a distance between the junction 122 and the center of the gate 104 is defined as C'. The correlations of these parameters are listed below:

A=A', B≠B', C=C'.

The gate side 124 overlaps with the lightly doped drain 112 and the gate side 126 overlaps with the lightly doped drain 114 so that the gate 104 is positioned under both of the lightly doped drain 112 and the lightly doped drain 114. In other embodiments of the present invention, however, it is not necessary for both of the two gate sides to overlap with the lightly doped drains. An adjustment can be made to change the relative positions of the gate to the lightly doped drains depending on the device electricity demands.

Figure 14:
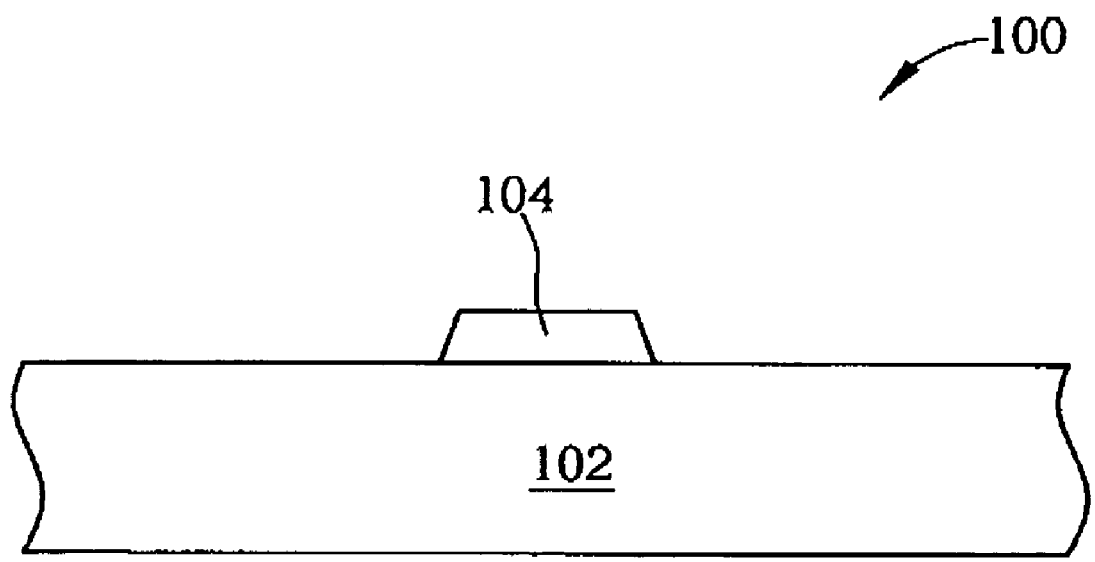
FIG. 14 to FIG. 18 are schematic diagrams illustrating a method of forming the bottom gate thin-film transistor shown in FIG. 13.
Figure 15:
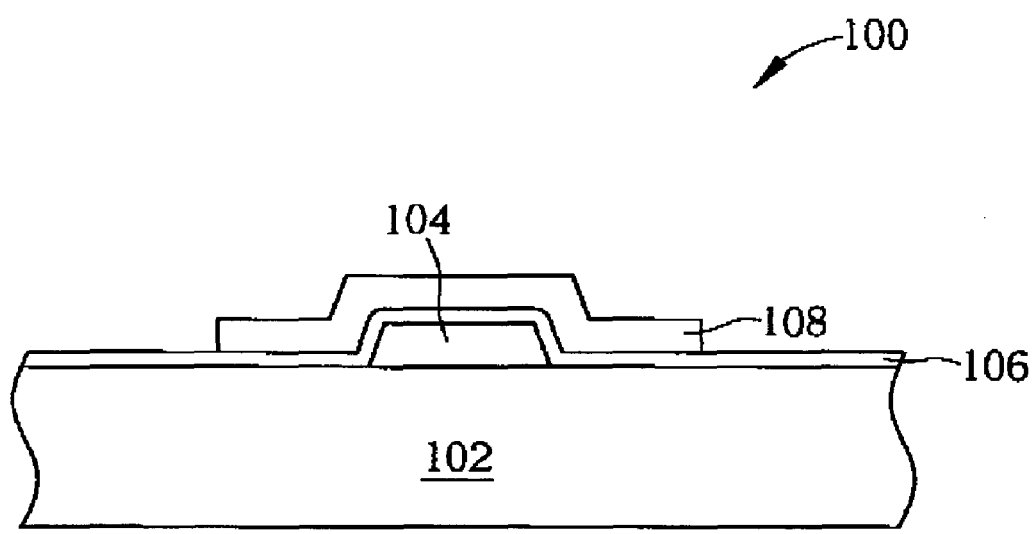

Please refer to FIG. 14 to FIG. 18. FIG. 14 to FIG. 18 are schematic diagrams illustrating a method of forming the bottom gate thin-film transistor 100 shown in FIG. 13. As shown in FIG. 14, a substrate 102 is provided, and a gate 104 is formed on the substrate 102. As shown in FIG. 15, a gate insulating layer 106 and a semiconductor layer 108 are respectively formed on the substrate 102. Then a photo-etching process (PEP) is performed to define the semiconductor layer 108.

Figure 16:
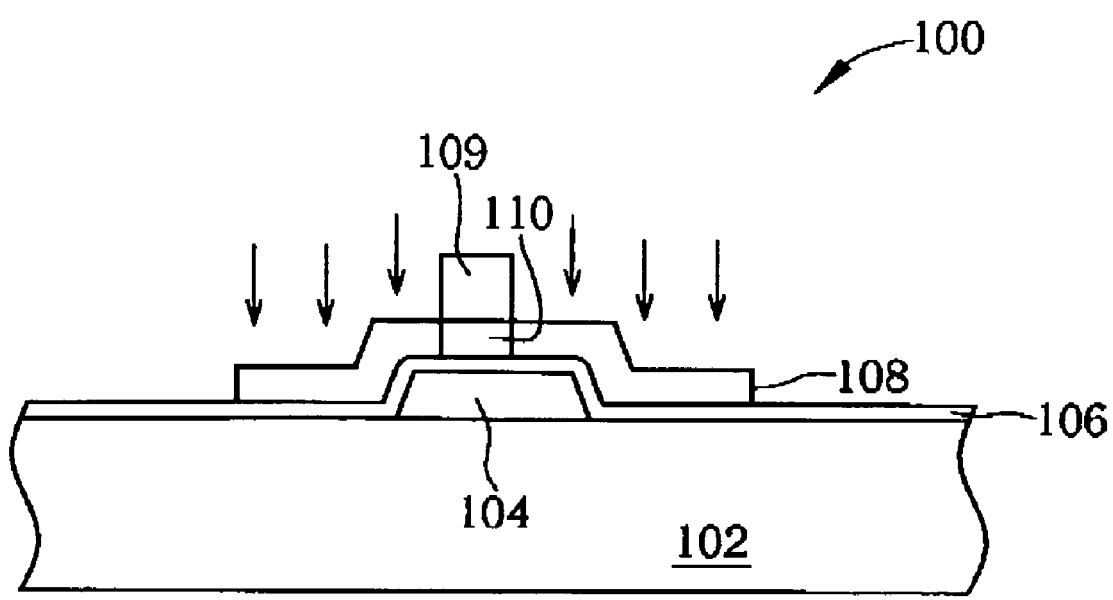
Figure 17:
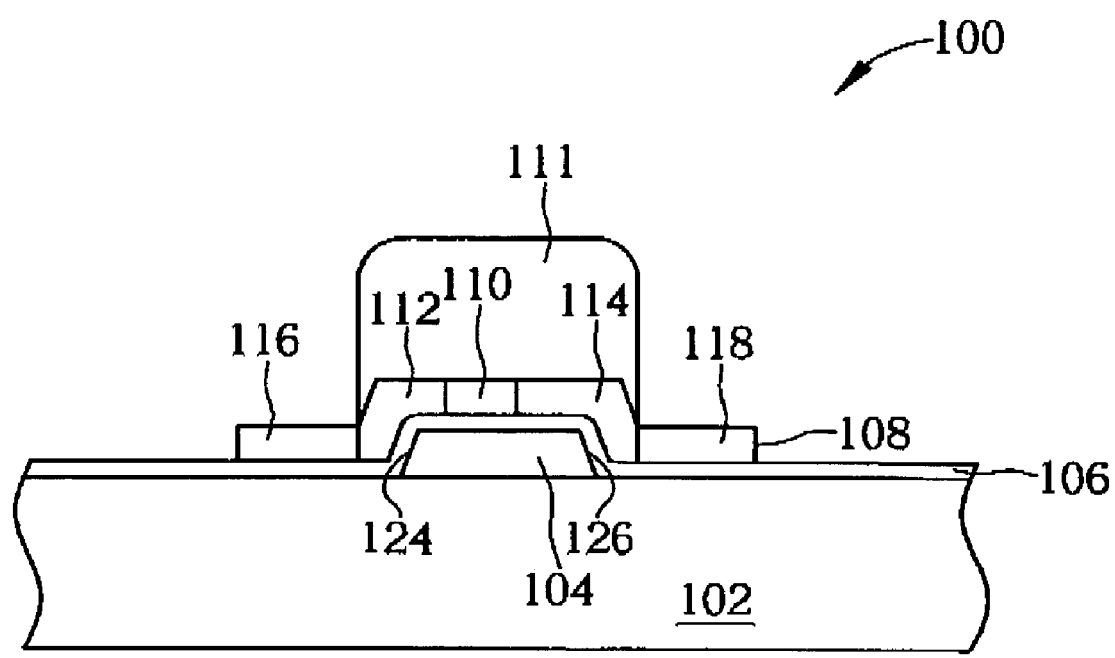
Figure 18:
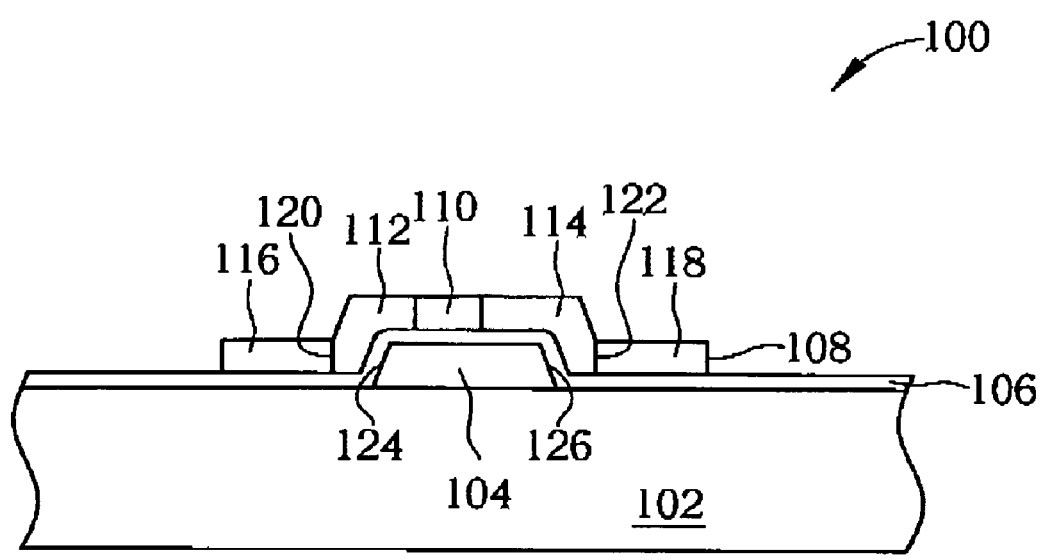

As shown in FIG. 16, a mask layer 109 is formed on the semiconductor layer 108, and an ion implantation process is performed to lightly dope the semiconductor layer 108 so that a channel region 110 is formed in the semiconductor layer 108 under the mask layer 109. As shown in FIG. 17, then the mask layer (not shown) is removed, and another mask layer 111 is formed on the semiconductor layer 108. Following that, another ion implantation process is performed to heavily dope the semiconductor layer 108 so that two lightly doped drains 112, 114, and two source/drain regions 116, 118 are formed in the semiconductor layer 108. As shown in FIG. 18, the mask layer (not shown) is removed to complete the bottom gate thin-film transistor 100.

It is appreciated that in the aforementioned embodiment, the asymmetry bottom gate thin-film transistor are accomplished by forming two lightly doped drains having different lengths. However, the asymmetry bottom gate thin-film transistor can also be implemented by forming a gate, and two equal size lightly doped drains deviating from the central line of the gate so that the two lightly doped drains have different overlapped regions with the gate.

In contrast to the symmetry thin-film transistor of the prior art, the thin-film transistor of the present invention has asymmetric lightly doped drains. A length of the lightly doped drain adjacent to the drain, which region has higher sensitivity to the leakage current problems, is increased to an appropriate value to reduce the leakage currents of the thin-film transistor. In addition, the series resistance between the drain and the source can also be reduced by decreasing a length of the lightly doped drain adjacent to the source, or even completely removing the lightly doped drain adjacent to the source. As a result, both of the electron mobility and the device operation speeds can be improved according to the present invention.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. An asymmetry thin-film transistor comprising:
   a substrate;
   a semiconductor layer positioned on the substrate, the
      semiconductor layer comprising a channel region, a first lightly doped region and a first heavily doped region positioned at a side of the channel region, a second lightly doped region and a second heavily doped region positioned at the other side of the channel region, the first lightly doped region, the first heavily doped region, the second lightly doped region, and the second heavily doped region being horizontally positioned in the semiconductor layer, the first lightly doped region and the second lightly doped having different lengths; and a gate positioned on the substrate, the gate having a central line extending through the gate, the semiconductor layer, and the substrate, the channel region being asymmetric with respect to the central line of the gate, the first lightly doped region and the second lightly doped region being asymmetric with respect to the central line of the gate.

2. The thin-film transistor of claim 1 wherein the gate is positioned above the semiconductor layer.

3. The thin-film transistor of claim 1 wherein the gate is positioned below the semiconductor layer.

4. The thin-film transistor of claim 1 wherein the gate partially overlaps with the first lightly doped region.

5. The thin-film transistor of claim 1 wherein the gate partially overlaps with the second lightly doped region.

6. The thin-film transistor of claim 1 wherein the first lightly doped region and the second lightly doped region comprise lightly doped drains.

7. The thin-film transistor of claim 1 wherein the first heavily doped drain and the second heavily doped drain comprise a source and a drain.

8. The thin-film transistor of claim 1 wherein a length of the first lightly doped region is approximately between 0 and 3.5 micrometers ($\mu m$).

9. The thin-film transistor of claim 1 wherein a length of the second lightly doped region is approximately between 0 and 3.5 $\mu m$.

10. The thin-film transistor of claim 1 wherein the semiconductor layer comprises n-type dopants.

11. The thin-film transistor of claim 1 wherein the semiconductor layer comprises p-type dopants.

12. The thin-film transistor of claim 1 wherein the gate comprises a metal layer.

13. The thin-film transistor of claim 1 wherein the gate comprises a doped polysilicon layer.

14. An asymmetry bottom gate thin-film transistor comprising:

a substrate;

a semiconductor layer positioned on the substrate, the semiconductor layer comprising a channel region, a first lightly doped region and a first heavily doped region positioned at a side of the channel region, a second lightly doped region and a second heavily doped region positioned at the other side of the channel region, the first lightly doped region, the first heavily doped region, the second lightly doped region, and the second heavily doped region being horizontally positioned in the semiconductor layer, the first lightly doped region and the second lightly doped having different lengths; and a gate positioned below the semiconductor layer, the gate having a central line extending through the gate, the semiconductor layer, and the substrate, the channel region being asymmetric with respect to the central line of the gate, the first lightly doped region and the second lightly doped region being asymmetric with respect to the central line of the gate.

15. The bottom gate thin-film transistor of claim 14 wherein the gate partially overlaps with the first lightly doped region.

16. The bottom gate thin-film transistor of claim 14 wherein the gate partially overlaps with the second lightly doped region.

17. The bottom gate thin-film transistor of claim 14 wherein the first lightly doped region and the second lightly doped region are lightly doped drains.

18. The bottom gate thin-film transistor of claim 14 wherein the first heavily doped drain and the second heavily doped drain are respectively a source and a drain.

19. The bottom gate thin-film transistor of claim 14 wherein a length of the first lightly doped region is approximately between 0 and 3.5 micrometers ($\mu m$).

20. The bottom gate thin-film transistor of claim 14 wherein a length of the second lightly doped region is approximately between 0 and 3.5 $\mu m$.

21. The bottom gate thin-film transistor of claim 14 wherein the semiconductor layer comprises n-type dopants.

22. The bottom gate thin-film transistor of claim 14 wherein the semiconductor layer comprises p-type dopants.

23. The bottom gate thin-film transistor of claim 14 wherein the gate comprises a metal layer.

24. The bottom gate thin-film transistor of claim 14 wherein the gate comprises a doped polysilicon layer.

25. An asymmetry thin-film transistor comprising:

a substrate;

a semiconductor layer positioned on the substrate, the semiconductor layer comprising a channel region, a first lightly doped region and a first heavily doped region positioned at a side of the channel region, a second lightly doped region and a second heavily doped region positioned at tine other side of the channel region, the first lightly doped region, the first heavily doped region, the second lightly doped region, and the second heavily doped region being horizontally positioned in the semiconductor layer, the semiconductor layer having a central line extending through the channel region and the substrate, the channel region being symmetric with respect to the central line of the semiconductor layer, the first lightly doped region and the second lightly doped region having equal lengths, and being symmetric with respect to the central line of the semiconductor layer; and a gate positioned on the substrate, the gate being asymmetric with respect to the central line of the semiconductor layer.

26. The asymmetry thin-film transistor of claim 25 wherein the gate is positioned on the semiconductor layer.

27. The asymmetry thin-film transistor of claim 25 wherein the gate is positioned below the semiconductor layer.

28. The asymmetry thin-film transistor of claim 25 wherein the gate partially overlaps with the first lightly doped region.

29. The asymmetry thin-film transistor or claim 25 wherein the gate partially overlaps with the second lightly doped region.

30. The asymmetry thin-film transistor or claim 25 wherein the first lightly doped region and the second lightly doped region are lightly doped drains.

31. The asymmetry thin-film transistor of claim 25 wherein the first heavily doped drain and the second heavily doped drain are respectively a source and a drain.

32. The asymmetry thin-film transistor of claim 25 wherein a length of the first lightly doped region is approximately between 0 and 3.5 micrometers (μm).

33. The asymmetry thin-film transistor of claim 25 wherein a length of the second lightly doped region is approximately between 0 and 3.5 μm.

34. The asymmetry thin-film transistor of claim 25 wherein the semiconductor layer comprises n-type dopants.

35. The asymmetry thin-film transistor of claim 25 wherein the semiconductor layer comprises p-type dopants.

36. The asymmetry thin-film transistor of claim 25 wherein the gate comprises a metal layer.

37. The asymmetry thin-film transistor of claim 25 wherein the gate comprises a doped polysilicon layer.

* * * * *